US006815842B2

(12) United States Patent
Fehd et al.

(10) Patent No.: US 6,815,842 B2
(45) Date of Patent: Nov. 9, 2004

(54) SEQUENTIAL CONTROL CIRCUIT

(75) Inventors: Brian Fehd, Brooklyn, NY (US); Marc Janowitz, Brooklyn, NY (US); Raymond C. Wszolek, III, Cortlandt Manor, NY (US); Edmund Xuequn Huang, Fremont, CA (US)

(73) Assignee: Production Solutions, Inc., Cortlandt Manor, NY (US)

( * ) Notice: Subject to any disclaimer, the term of this patent is extended or adjusted under 35 U.S.C. 154(b) by 249 days.

(21) Appl. No.: 09/791,383

(22) Filed: Feb. 23, 2001

(65) Prior Publication Data

US 2002/0033680 A1 Mar. 21, 2002

Related U.S. Application Data

(60) Provisional application No. 60/184,333, filed on Feb. 23, 2000.

(51) Int. Cl.[7] .............................................. H05B 37/00

(52) U.S. Cl. ........................... 307/40; 315/324; 700/11

(58) Field of Search ........................... 307/40; 315/291, 315/123

(56) References Cited

U.S. PATENT DOCUMENTS

| | | | | |
|---|---|---|---|---|
| 4,177,388 A | 12/1979 | Lingenfelter | ................. | 307/38 |
| 4,215,277 A | 7/1980 | Weiner et al. | ................ | 307/41 |

(List continued on next page.)

FOREIGN PATENT DOCUMENTS

| | | | | |
|---|---|---|---|---|
| EP | 0 817 536 A2 | 1/1998 | ........... | H05B/33/08 |
| EP | 1 026 922 A | 8/2000 | ........... | H05B/33/00 |
| WO | WO 97/27576 | 7/1997 | ............ | G09G/3/30 |
| WO | WO 99/17589 | 4/1999 | ........... | H05B/33/00 |

OTHER PUBLICATIONS

Martin, "RS–232 to RS–485 Protocol Conversion with the 2504 and 2510 controllers", 1998.*

Joe Knisley, "Understanding Lamp Dimming Technologies", Feb. 2003, Electrical Construction & Maintenance Magazine.*

Soundlight, "The Soundlight DMX booklet", Aug. 2001.*

Fairchild Semiconductor, "DM74LS154 4–Line to 16–Line Decoder/Demultiplexer", Mar. 1998.*

*Primary Examiner*—Brian Sircus
*Assistant Examiner*—Roberto J. Rios
(74) *Attorney, Agent, or Firm*—Winston & Strawn LLP

(57) ABSTRACT

A control circuit for driving a plurality of electrical loads, one at a time, has a converter circuit for receiving a DMX compatible digital control signal and extracting a plurality of address bits therefrom. A decoder circuit receives the digital address bits and generates a plurality of enable signals, each corresponding to a particular load. One of the load enable signals is in an active state and each other enable signal is in an inactive state at any one time. A relay circuit for receives the enable signals, and in response passes an electrical drive signal to the electrical load corresponding to the enable signal that is in the active state. The relay circuit preferably includes a plurality of relay devices each coupled to one of the enable signals and a plurality of discharge circuits for rapidly discharging each electrical load when the enable signal corresponding to that load changes from the active state to the inactive state.

27 Claims, 11 Drawing Sheets

U.S. PATENT DOCUMENTS 4,238,793 A 12/1980 Hochstrate .................. 340/781
4,388,567 A 6/1983 Yamazaki et al. .......... 315/291
4,404,556 A 9/1983 Messina et al. ........ 340/825.03
4,410,794 A 10/1983 Williams .................... 219/486
4,574,355 A 3/1986 Beatty et al. ............... 364/492
4,780,621 A 10/1988 Bartleucci et al. ............ 307/11
4,890,000 A 12/1989 Chou .......................... 307/36
4,924,151 A 5/1990 D'Aleo et al. ............. 315/295
5,467,073 A * 11/1995 Elias .......................... 340/464
5,621,252 A 4/1997 Bucknam ................... 307/10.2
5,621,282 A 4/1997 Haskell ...................... 315/324
5,644,194 A * 7/1997 Chang ........................ 315/123
5,668,537 A 9/1997 Chansky et al. ....... 340/825.06
5,872,513 A * 2/1999 Fitzgibbon et al. ........ 340/5.28
5,914,573 A * 6/1999 Lin ............................ 315/315
5,917,252 A 6/1999 Tokunaga .................... 307/38
6,020,825 A 2/2000 Chansky et al. ....... 340/825.06
6,140,799 A * 10/2000 Thomasson ................. 320/117
6,150,774 A * 11/2000 Mueller et al. ............. 315/291
6,222,441 B1 * 4/2001 Siegwarth ............. 340/310.02
6,249,092 B1 * 6/2001 Kanatani .................... 315/316
6,271,634 B1 * 8/2001 Saiger .................... 315/241 S
6,323,605 B1 * 11/2001 Greenberg et al. .......... 315/291
6,353,908 B1 * 3/2002 Heinrich ..................... 714/748
6,369,524 B1 * 4/2002 Sid ............................ 315/292
6,456,960 B1 * 9/2002 Williams et al. ............ 702/188
6,517,216 B1 * 2/2003 Cercone et al. ............. 362/220

* cited by examiner

300

SEQUENTIAL CONTROL CIRCUIT

CROSS REFERENCE TO RELATED APPLICATION

This application claims the benefit of priority from U.S. Provisional Patent Application Ser. No. 60/184,333 filed Feb. 23, 2000 and entitled "Circuit Animator", the contents of which are incorporated herein by reference.

FIELD OF THE INVENTION

The present invention relates to a control circuit for driving and activating a plurality of electrical loads, especially electroluminescent loads such as electroluminescent fibers. More particularly, the present invention relates to a control circuit for sequentially driving such loads, one at a time (or one subset at a time), using the same power supply.

BACKGROUND OF THE INVENTION

Lighting controllers (e.g., lighting consoles or boards) are commonly found in theatrical, architectural, and entertainment venues. These controllers are operated by an individual and/or a computer system to activate and control relays, switches, dimmers, illuminators, and other control devices that are integrated within a lighting system. Those control devices are in turn connected to lighting devices (and possibly other devices such as mirrors, gobo wheels, and smoke machines) to operate or enable the lighting devices in a desired manner. In most lighting systems, controllers activate and interface with control devices using the Digital Multiplex (DMX) protocol. The DMX (or DMX-512) protocol is a digital control signal standard published by the United States Institute for Theatre Technology (USITT) and is used extensively within the lighting industry (a corresponding Analog Mulitplex, AMX or AMX-192, protocol also exists). A DMX signal can be used to control timed events, color changes, scene changes, and numerous other effects.

The current DMX control standard (established in 1986 and revised in 1990) provides up to 512 control channels per data link. Each device needs a certain number of DMX channels for proper operation. Some control devices require only one or two channels, while others may use 20 or more channels with separate channels controlling different effects such as activation, dimming, color, strobing, tilting, and rotation. Each control device in a lighting system is assigned a DMX start channel or address number (if a device uses several channels, those channels are addressed sequentially beginning at the start address). DMX channel assignment is typically achieved by setting a DIP (dual in-line package) switch on each control device. Once channels have been assigned, the devices are typically connected in a serial or daisy-chain configuration, in which the controller connects to an input of a first control device, an output of the first control device connects to an input of a second control device, and so on.

A DMX control signal provides data in an asynchronous serial format at 250 kbps via the industry standard RS-485 interface (also known as EIA-485). A typical DMX data packet includes a reset condition, followed by a start code and up to 512 bytes of control data, with one data byte for each channel. The start code is usually a "0" byte, however, a unique start code can also be used to indicate to a receiving device that a data packet containing proprietary information is being sent. Each channel byte in a packet provides information for controlling the corresponding device or device feature. Although the DMX standard was originally designed to carry dimmer information (i.e., information directly affecting the proportional output from a stage lighting dimmer), DMX control data has since evolved to carry information for moving lights, color changers, and a variety of other devices used within entertainment and architectural lighting industries. Typically, by programming or sliding a potentiometer on a control console, a control output can be varied from 0–100% (with 8-bit resolution).

The data packets in a DMX signal are transmitted continuously, optionally with no delay between packets. As a result, the fewer channels used, the higher the possible refresh rate in the DMX control signal. Generally, the number of channels used in a given lighting system will vary according to the needs of the lighting system, however many lighting controllers use only a fraction of all available DMX channels. A more thorough description of the DMX-512 protocol is provided by John Huntington in *Control Systems for Live Entertainment*, Focal Press (1994), relevant portions of which are incorporated herein by virtue of this reference.

DMX control channels are generally assigned on a one-to-one basis corresponding to the various outputs (devices or features) that need to be controlled. Power is routed to the dimming or switching control devices and then internally distributed to multiple outputs. Conventional DMX control devices used in the lighting industry can control from one to many thousands of outputs, either one at a time or in any combination of multiple outputs. As a result, these devices are capable of providing considerable design versatility and flexibility, especially in controlling a number of lighting devices simultaneously. However, conventional DMX control systems may be wasteful and inefficient for certain lighting applications. In particular, in many lighting systems it is often desirable to activate a large number of loads (such as electroluminescent fibers), one at a time (or one subset at a time), in a desired sequence or order. When such sequencing applications are performed using conventional DMX lighting control, a separate relay (or other control device) and separate power supply are generally used to activate and energize each lighting device or load. Consequently, at any one time during the sequencing, all but one of the power supplies is idle and unused, resulting in significant technical and economic inefficiencies.

Sequencing control systems for driving a plurality of loads using a single power supply have been developed. For example, Weiner et al. in U.S. Pat. No. 4,215,277 describe a controller for sequentially energizing a plurality of light strings, each connected to an outlet receptacle via a triac switching device. A timing and logic circuit connects to a gating circuit for each triac switching device to provide selective energization of the triac and the corresponding light means connected to that triac. Similarly, Williams in U.S. Pat. No. 4,410,794 discloses a switching system for sequentially connecting an alternating current supply to a plurality of loads, in particular heater loads in an aircraft de-icing system. The system includes a computer for generating switch selection data, in the form of serial bits, to a distributor arrangement that decodes the selection data and provides control signals to switch devices that connect the loads to the supply. The distributor arrangement includes a circuit for inhibiting the supply of control signals to the respective switch devices unless the voltage of the supply phase connected by the device is substantially zero. The control signals are also time-advanced with respect to the zero voltage condition so that the switch devices can be placed in states in which they can connect a load prior to disconnection of a preceding load.

However, such prior art sequencing control systems are generally not compatible for operation with a DMX controller. This is disadvantageous since—given the wide spread adoption of the DMX protocol in the lighting industry—lighting designers, stage hands, theater electricians, architectural lighting consultants, and special effects designers are accustomed to programming DMX controllers and are familiar with the usage, distribution and maintenance of DMX systems. Compatibly with the DMX protocol also conveniently allows the same control signal used to effect the sequencing operation to also operate and activate other devices in a lighting system that are unrelated to the lighting devices being sequentially switched.

In addition, the intensity and color of electroluminescent loads, such as electroluminescent fibers, may be varied based on the voltage and frequency, respectively, of the power supply signal. For example, it may be desirable for the power supply signal to vary between 90–150 VAC and 400–2500 Hz to adequately exploit the potential for intensity and color variation in a fiber. However, the above described prior art sequencing control systems are generally unsuitable for efficiently switching between lighting devices that may be powered by a variable power supply signal having a relatively high rms voltage (e.g., up to 150 VAC or more) and high frequency (e.g., over 2 KHz). Although, the switching system of Williams switches between loads only when the voltage of the supply phase connected by the device is substantially zero, additional circuitry is needed to perform this function and limitations on the flexibility to switch between loads result.

Furthermore, it is often desirable for an electroluminescent load to appear as if it "snaps on" when enabled and "snaps off" when disabled, generally in a time less than or equal to 50 ms. Since an electroluminescent load effectively acts as a light emitting capacitor, when a driving voltage is removed from an electroluminescent load the voltage across the load discharges relatively slowly, making the snapping off effect difficult to achieve with the above described sequential control systems.

Consequently, there is a need for a control circuit that is capable of sequentially activating a plurality of electrical (particularly electroluminescent) loads in an efficient manner, that is capable of switching a relatively high voltage and frequency power supply signal between loads, that is able to provide a desired snap off effect when disabling a load, and that is compatible with DMX controllers and signaling. It would be further advantageous if such a control circuit used only a minimal number of DMX channels to sequentially control a large number of loads so that additional DMX channels or resources are available for controlling other devices and so that the DMX control signal is refreshed at a higher rate.

SUMMARY OF THE INVENTION

The present invention relates to a control circuit suitable for sequentially driving a plurality of electrical loads, such as electroluminescent loads in any desired order. The loads may be driven one at a time or one subset at a time.

In one aspect, the control circuit is preferably compatible with the standard lighting control signal protocol DMX-512, but alleviates many of the economic and technical burdens associated with conventional one-to-one DMX switching systems. In particular, when sequencing of plurality of electrical loads, it is not necessary to fully exploit the versatility offered in conventional DMX switching systems. In addition, it is not cost effective to use an individual power supply (such as an inverter, neon transformer, DC power supply, etc.) to drive each of the loads. The present invention exploits the convenience of using a DMX interface and control protocol but only requires a minimal number of DMX channels and only one inverter power supply (or other power source depending on load) to control and power the sequencing of a large number of outputs or loads. In another aspect, the control circuit permits the switching of an electrical drive signal (e.g., an inverter output voltage) between a plurality of electroluminescent loads in a rapid, efficient, and appropriate manner including the ability to "snap" loads on and off, even where the voltage and/or frequency of the electrical drive signal varies. The control circuit of the present invention is also preferably implemented in a modular configuration so that sequencing applications with varying numbers of loads can be easily accommodated.

Thus, in one embodiment, the present invention provides a control circuit for sequentially driving a plurality of electrical loads (e.g., one at a time) in which a converter circuit receives a DMX compatible digital control signal and extracts a plurality of address bits from that signal. A decoder circuit receives the digital address bits and in response generates a plurality of enable signals, each corresponding to a particular electrical load. At any one time, only a subset of the load enable signals is in an active state and each other enable signal is in an inactive state. In one embodiment, only one load enable signal can be active at any one time. A relay circuit then receives the plurality of enable signals, and in response passes an electrical drive signal, such as an inverter voltage, to each electrical load that corresponds to an enable signal that is in the active state.

Where the converter circuit extracts M address bits, the decoder circuit generates N enable signals, where N and M are integers with $N \leqq 2^M$. In one preferred embodiment $N=2^M$, e.g. M=8 and N=256. Preferably, the converter circuit extracts the plurality of address bits from data bytes for one or more DMX channels in the control signal. For example, the converter circuit may extract one address bit from a data byte for each of a plurality of DMX channels in the control signal. Alternatively, the converter circuit may extract the plurality of address bits from a data byte for a single DMX channel in the control signal (e.g., all eight channel bits). The converter circuit may comprise an address switch for specifying a DMX start channel.

The relay circuit may comprise a first plurality of relay devices, each coupled to one of the enable signals so that when that enable signal is in the active state, the electrical drive signal is coupled or passed to the corresponding electrical load. The first relay devices are preferably a solid state relay devices, but they may also be electromechanical relay device or any other type of relay devices. Especially in the case of electroluminescent loads, the relay circuit preferably also comprises a plurality of discharge circuits for rapidly discharging each electrical load when the enable signal corresponding to that load changes from the active state to the inactive state. Each discharge circuit preferably comprises a second relay device and also preferably establishes a low impedance shunt connection across the corresponding electrical load when the enable signal corresponding to that load changes from the active state to the inactive state.

The electrical drive signal may be an AC voltage signal and may have a variable frequency and/or voltage which are also controlled by other channels in the DMX control signal. In one implementation of the control circuit, the relay circuit is implemented on a plurality of boards, each board corresponding to a group of electrical loads. In another implementation, the decoder circuit and the relay circuit are implemented on a plurality of boards, each board corresponding to a group of electrical loads.

In another embodiment, the present invention provides a control circuit for sequentially driving a plurality of electroluminescent loads. The control circuit comprises a decoder circuit for receiving a digital address signal and in response generating a plurality of enable signals, each corresponding to a particular electrical load. Again, at any one time, only a subset of the load enable signals is in an active state and each other enable signal being in an inactive state. A relay circuit comprises a plurality of first relay devices each coupled to one of the plurality of enable signals as well as to the load corresponding to that enable signal. When that enable signal is in the active state, the relay device couples the electrical drive signal to the corresponding electrical load. The relay circuit also comprises a plurality of discharge circuits for rapidly discharging each electrical load when the enable signal corresponding to that load changes from the active state to the inactive state. Each discharge circuit comprises a second relay device, and both the first and second relay devices are preferably solid state relay devices.

BRIEF DESCRIPTION OF THE DRAWINGS

Preferred features of the present invention are disclosed, by way of example, in the accompanying drawings, wherein.

DETAILED DESCRIPTION OF THE INVENTION

Figure 1A:
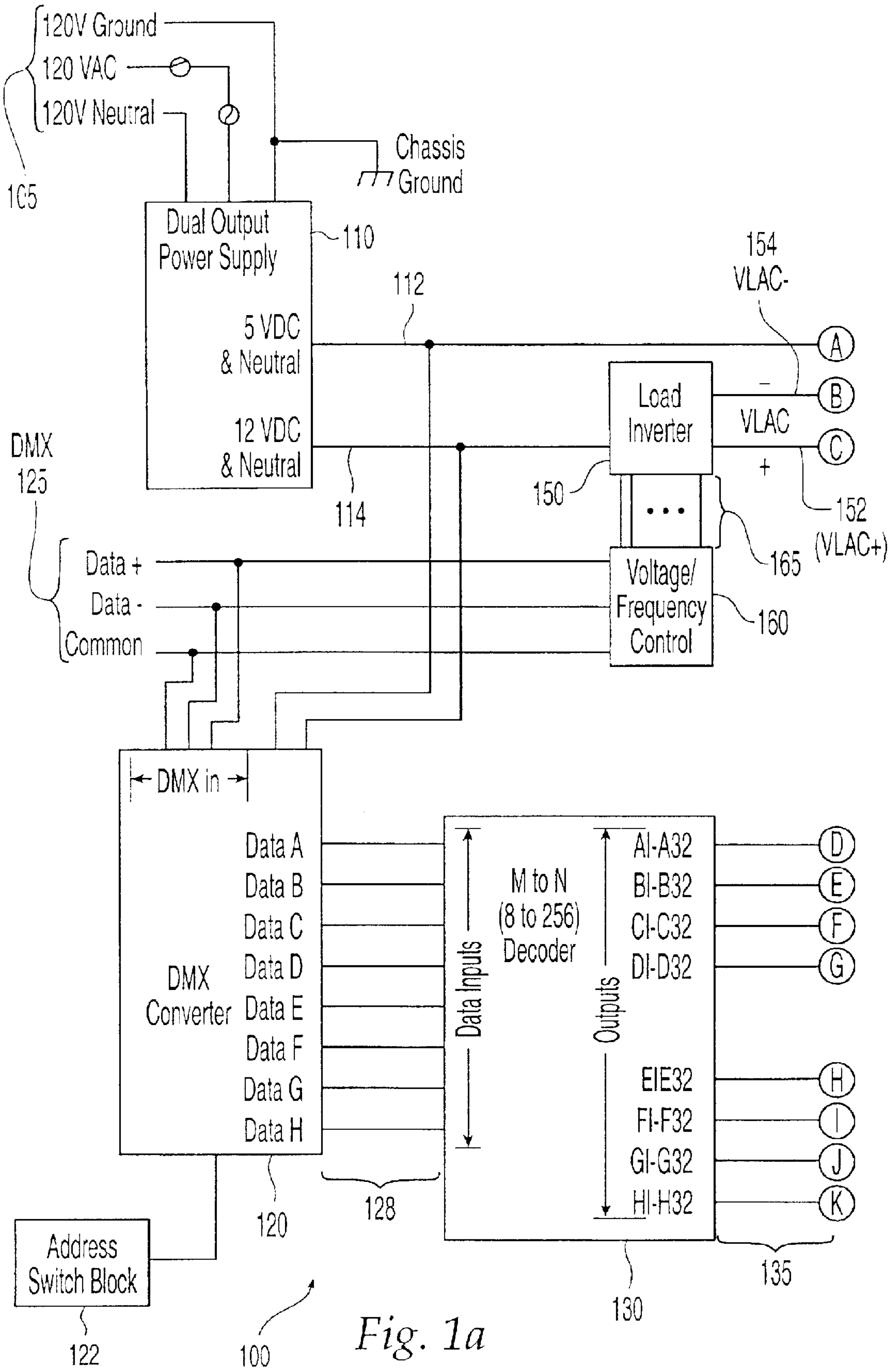
FIGS. 1*a*–1*b*. are a block circuit diagram illustrating an overall architecture for a control circuit in accordance with a preferred embodiment of the present invention.
Figure 1B:
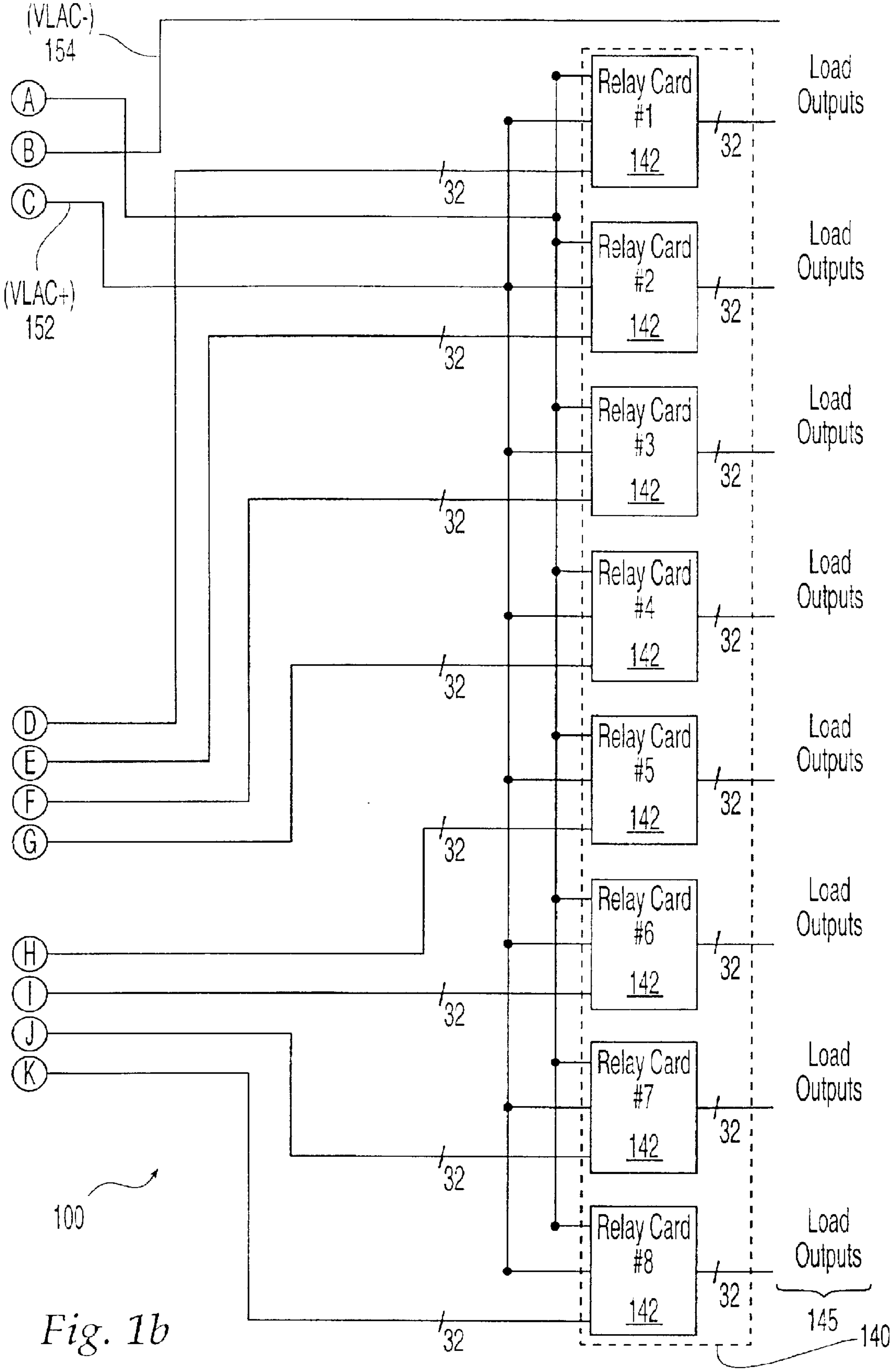

FIGS. 1*a*–1*b* are a block diagram of a control circuit 100, in accordance with a preferred embodiment of the present invention, for sequentially driving a plurality of electrical loads in any desired order. Signal flow between FIGS. 1*a* and 1*b* is identified by circle connectors A through K as shown. Sequential control circuit 100 is particularly suitable for driving electroluminescent loads or lamps such as electroluminescent fibers (e.g., LiveWire™ fibers), panels, or backlights. However, control circuit 100 may be used to control and sequence other types of electrical loads which include, but are not limited to, solenoids, loads used for pyrotechnical effect, ropelight loads, incandescent lamps, neon lamps, light emitting diodes, and loads used for confetti effects. Sequential circuit 100 generally forms part of an overall control device (not shown) and, as such, is preferably incorporated into an enclosure or housing for the device. Although, the control circuit 100 is particularly suitable for theater and architectural lighting and entertainment applications, it may be used for other types of applications as well.

Referring to FIGS. 1*a*–1*b*, sequential control circuit 100 includes a power supply circuit 110, a DMX signal converter (or decoder) 120, an M-to-N address decoder circuit 130 (shown as a 8–256 decoder in the illustrated embodiment of FIGS. 1*a*–1*b*), a relay circuit 140, an inverter circuit 150, and a voltage/frequency controller 160.

As shown in FIGS. 1*a*–1*b*, power supply circuit 110 generally receives an AC supply signal 105, such as a conventional 120 VAC signal at 60 Hz as illustrated in FIGS. 1*a*–1*b*. Alternatively, supply signal 105 may be a 240 VAC signal at 50 Hz or some other suitable power supply input signal that is preferably from 90–240 VAC at 50–60 Hz. The input power line providing signal 105 may be fused for over current protection, and a ground connection from the power line (e.g., through a ground conductor in a power cord) is preferably bonded to a chassis or enclosure of a controller device that houses control circuit 100 to ensure that all components are properly grounded where applicable. Power supply circuit 110 may include a main power switch (not shown), such as a lighted rocker style switch or equivalent.

In known manner, power supply circuit 110 converts input AC supply signal 105 into one or more DC output signals. In the illustrated embodiment of FIGS. 1*a*–1*b*, circuit 110 is a dual output power supply that provides two DC output signals 112 and 114 (with corresponding ground or neutral references—although only one line is shown in each case for the sake of clarity). As shown, signal 112 is a DC signal substantially at 5 VDC and 1 Amp that is provided for Vcc logic to DMX converter 120, address decoder circuit 130, and to relay circuit 140. Signal 114 is a DC signal substantially at 12 VDC and 1 Amp that is provided for Vcc logic to DMX converter 120 and, as a DC input, to inverter circuit 150. In alternate embodiments, power supply circuit 110 may only provide a single DC output, for example only signal 112 may be provided where DMX converter 120 is designed to operate with only 5VDC Vcc logic and inverter circuit 150 is similarly designed to generate a desired AC load voltage signal with a 5VDC input.

As illustrated in the preferred embodiment FIGS. 1*a*–1*b*, in addition to signals 112 and 114, DMX converter circuit 120 receives a DMX control signal 125. As described above, a DMX control signals may be generated by an industry standard lighting controller (not shown) to control a number of lighting devices and/or other types of devices. DMX signal 125 is provided to converter 120 using standard DMX-compatible cable and connectors, such as a five-pin XLR connector (not shown). As shown in FIGS. 1*a*–1*b*, the connector to converter 120 has a primary data true pin (Data+), a primary data complement pin (Data−), and a common or ground pin (Common). (Optionally, the cable and connectors may also support the transmission of secondary data from converter circuit 120 back to the lighting controller using pins reserved for reverse communication or "talk back" in advanced control systems.)

As shown in FIGS. 1*a*–1*b*, DMX converter circuit 120 also comprises an address switch block 122, which may include a three digit push button switch or the like, for specifying a DMX start channel for converter 120. Address switch 122 is preferably mounted to allow re-addressing without having to open any device enclosure within which control circuit 100 is housed, for example by mounting address switch 122 on the front or rear panel of the device enclosure. More generally, DMX channel addressing may be achieved using any appropriate means, including a software setting. As described above, the DMX start channel address specifies to DMX converter circuit 120 which channels to monitor in DMX signal 125.

DMX converter circuit 120 outputs a plurality of M address bits 128 in parallel (each address bit 128 may be triggered using a solid state relay, not shown). The address bits are used to specify the particular output or load that is being driven by circuit 100 at any one time. As will be appreciated, depending on the application, each load may comprise one or more devices that are to be activated at the same time. Furthermore, although in the illustrated embodiment, the loads are sequentially driven one load at a time, it is alternatively possible, as described in more detail below, for different subsets of loads to be sequentially drive. In the embodiment specifically illustrated in FIGS. 1*a*–1*b*, eight address bits 128 are generated (Data A through Data H) so that up to $2^8$=256 outputs or loads can be sequentially driven by circuit 100. As will be appreciated by those skilled in the art, the total number of potential outputs in circuit 100 is equal to $2^M$, so that if an additional address bit 128 is provided, the number of potential outputs in circuit 100 may be doubled. In this invention, M can be any integer greater than or equal to one and N can be any integer greater than or equal to two.

In one embodiment, the M-bit address information is provided on M DMX channels in DMX control signal 125. DMX converter circuit 120 then decodes the M DMX channels, beginning at the start channel specified by address switch block 122, into M distinct address bits (preferably, as 5VDC signals). The address information may be encoded, for example, into the first bit of each of the M DMX channel data bytes (as described below, the other bits in each of the M channels may be used to provide additional control information). As noted above, each DMX data packet can potentially be decoded into as many as 512 channels, so that as many as 512 channels can be used to provide additional address bits to expand the number of outputs. In addition, channels in DMX signal 125 that are not used by DMX converter 120 may also be used to control additional devices in a lighting system. Where M=8 (or less) in this embodiment, DMX converter circuit 120 may comprise the MR6-SSR circuit board manufactured by Fleenor Design in Arroyo Grande, Calif.; however, other suitable decoder circuits may also be used.

In an alternative embodiment, instead of using M DMX channels to generate the M address bits 128, DMX converter 120 may alternatively be configured to use only one DMX channel to drive up to 256 outputs or loads. In this embodiment, the address information is encoded in all eight bits of the DMX channel byte (or as many of the channel bits as are needed to drive the number of outputs or loads in circuit 100, e.g., if 128 or less outputs are needed only seven channel bits are required). Thus, where M=8, the eight bits in the dedicated DMX channel byte correspond directly to the Data A through Data H bits 128, and DMX converter circuit 120 converts the address bits from the DMX serial format to the parallel output format of bits 128. As will be appreciated, the use of a second DMX channel to provide more than 8 bits of address information allows DMX converter 120 to support up to over 65,000 outputs or loads. Again, the DMX channel (or channels) containing the output address information is specified by the start channel address set in block 122. Advantageously, in this embodiment, fewer DMX channels are needed to encode the address information for N outputs than in the embodiment that uses M DMX channels. Furthermore, the amount of programming time necessary for an end user to select a desired output through a lighting controller is also reduced, i.e., instead of programming (or sliding) M potentiometers, a user need only program one potentiometer on a lighting controller to select one of up to 256 outputs (or two potentiometers to select one of up to more than 65,000 outputs).

As a further alternative, sequential control circuit 100 may receive a dedicated control or address signal (not shown) instead of DMX control signal 125. In this case, circuit 100 does not require DMX converter circuit 120. For example, control circuit 100 may receive an M-bit address signal generated by a DIP switch or a dedicated controller, eliminating the need for DMX decoding. In this embodiment, if the dedicated control or address signal is provided in a parallel format it may be sent directly to M to N decoder 130. Alternatively, if the control signal is sent in a serial format, a serial-to-parallel converter circuit may be employed to provide the M address bits in parallel format to decoder 130.

Referring still to FIGS. 1*a*–1*b*, the M address bits 128 (Data A–H) are provided to M to N decoder circuit 130, which decodes the address bits into N decoder output or enable signals 135, where $N \leqq 2^M$. As indicated, in the specific embodiment illustrated in FIGS. 1*a*–1*b*, M=8 and N=256. Once decoded, all but one of decoder output signals 135 are in a first or enable state while all of the other N-1 decoder output signals 135 are in a second or disable state. Each decoder output signal 135 corresponds, on a one-to-one basis, with an output 145 used to drive a load (or group of loads) connected to control circuit 100. Therefore, only one load output 145 can be enabled at a time by a decoder output signal 135. Possible implementations of M to N decoder circuit 130 are described below in connection with FIGS. 2*a*–2*c* and FIGS. 3*a*–3*c* respectively.

It will be appreciated that DMX control signal 125 (or any other control signal input to circuit 100) can be programmed using a lighting controller to sequence or switch between any outputs 145 or loads in any desired order. The time to switch from one output 145 to the next in a desired sequence is dependent on the timing of address changes in address bits 128, and, the timing of address changes can also be programmed into the DMX signal 125 (or other control signal). For example, it may be desirable to switch or sequence the driving of a number of electroluminescent loads at between 50 milliseconds and 1 second, to provide a desired lighting effect. In addition, as discussed below, the ability to switch between loads at a high rate or speed, as well as the ability to "snap-off" a previously activated load, may also be affected by the operation of relay circuit 140 as well as the type of loads being sequenced.

Each decoder 130 output signal 135 is provided to relay circuit 140 where the corresponding load output signal 145 is generated, as shown in FIGS. 1*a*–1*b*. Relay circuit 140 also receives the 5VDC signal 112 from power supply circuit 110 as well as the signal on one of the output lines 152 and 154 that provides a differential output AC drive voltage VLAC from inverter circuit 150. In the illustrated embodiment, inverter output line 152 (or VLAC+) is provided to relay circuit 140 while inverter output line 154 (or VLAC–) is provided directly to each load. (Thus, inverter output line 152 may be considered a hot lead while inverter output line 154 may be considered a neutral lead that is bussed out to each load.) Thus, as described in further detail below, relay circuit 140 effectively acts to relay or gate the VLAC drive voltage, in particular the signal on VLAC output line 152. As a result, the output voltage applied to each load is provided between each load output 145 (the relayed version of the signal on output line 152) and output line 154. Importantly, relay circuit 140 enables the voltage applied to each load to be switched in a rapid, efficient, and appropriate manner.

Depending on the types of components used in relay circuit 140 and on the number N of output signals 145, it may be preferable to physically implement relay circuit 140 on a plurality of different relay circuit cards 142, as shown in FIGS. 1*a*–1*b*. Where this occurs, each relay circuit card 142 receives a group of decoder output signals 135 and provides a corresponding group of load outputs 145. For example, in FIGS. 1*a*–1*b*, where N=256 outputs are provided by circuit 100, the decoder outputs 135 and load outputs 145 are grouped into eight groups of 32 signals. As described in more detail below, relay circuit cards 142 may each also include a part of M to N decoder circuit 130 thereon (so that decoder 130 is implemented in a decentralized manner, as opposed to on a separate decoder 130 card).

Referring still to FIGS. 1*a*–1*b*, inverter circuit 150 is a standard DC-AC inverter well known to those of ordinary skill in the art, such as an inverter manufactured by Inverter Design Inc. of Tex. or Endicott Research Group in New York. Inverter circuit 150 receives the 12VDC signal 114 as a DC input and provides AC voltage VLAC between terminals 152 and 154 as an output. When used to drive electroluminescent loads, particularly electroluminescent fibers, inverter circuit 150 is preferably able to generate a VLAC signal within the following parameter ranges: 90–150 VAC in rms voltage, 50–100 mA in rms current, and 400 to 2500 Hz in frequency. It will be appreciated that other types of power supplies capable of generating a suitable output for driving an electrical load can also be used in place of inverter circuit 150.

As also shown in FIGS. 1*a*–1*b*, a voltage/frequency control device 160 preferably receives DMX control signal 125 and in response provides control signals 165 to inverter circuit 150. In known manner, control device 160 may act as a dimmer by, for example, generating a control signal 165 that regulates the DC voltage input to inverter circuit 150 (i.e., signal 114 in FIGS. 1*a*–1*b*). This enables the amplitude of the output voltage applied to an electroluminescent load (or other dimmable load), and thereby the load's apparent brightness or intensity, to be varied. Similarly, control device 160 may act as a color changer by generating one or more control signals 165 that modulates the frequency of VLAC (and therefore also of the load output voltage) to change the color emitted by an electroluminescent load. For example, in known manner, control signals 165 may gate switches in a bridge circuit in inverter 150 to control how often the direction of current through the bridge changes (and thereby the period or frequency of VLAC). For other type of loads, control device 160 may vary the voltage and/or frequency of VLAC to adjust other load effects that are dependent on those signal parameters.

As noted above, DMX control signal 125 can conveniently include the necessary data for control device 160 to alter the load effects in a desired manner. In a preferred embodiment, control data for device 160 is provided within one or DMX channels (similar to converter 120, control device 160 may also have an DMX address switch for specifying a DMX start channel). For example, one DMX channel may contain information for regulating the rms voltage of VLAC, while another DMX channel may contain information for regulating the frequency of VLAC. Alternatively, where address bit 128 information is encoded as a single bit in each of M DMX channels, the other seven bits in each of those channels may contain voltage and/or frequency control information for inverter 150. Optionally, in this case, DMX converter 125 and control device 160 may be combined into a single device. Additional DMX channels in signal 125 can further be used to control the functionality of a ballast (e.g., for neon loads) or to control other electrical loads/devices independently of control circuit 100, allowing control circuit 100 to be used in a versatile and flexible manner within an application. Although the use of a DMX control signal is preferred due to the facility with which is enables different types of control information to be combined within a single signal, it will nevertheless be appreciated that other types of control signals may be used to control device 160 (as well as to provide address bits 128 as described above).

Figure 2A:
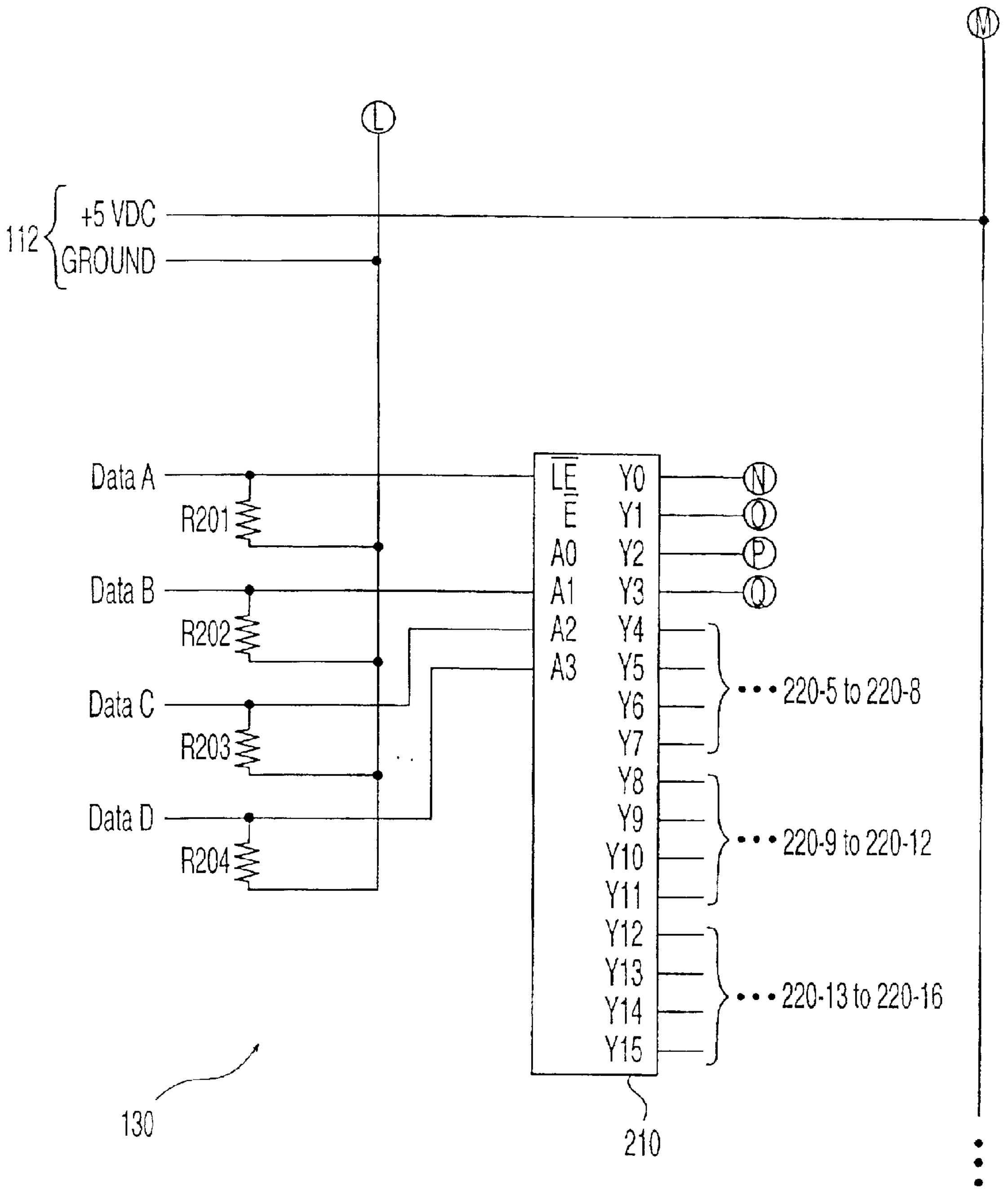
FIGS. 2*a*–2*c* are a block circuit diagram illustrating a possible implementation for the M to N decoder circuit in the control circuit of FIGS. 1*a*–1*b;*
Figure 2B:
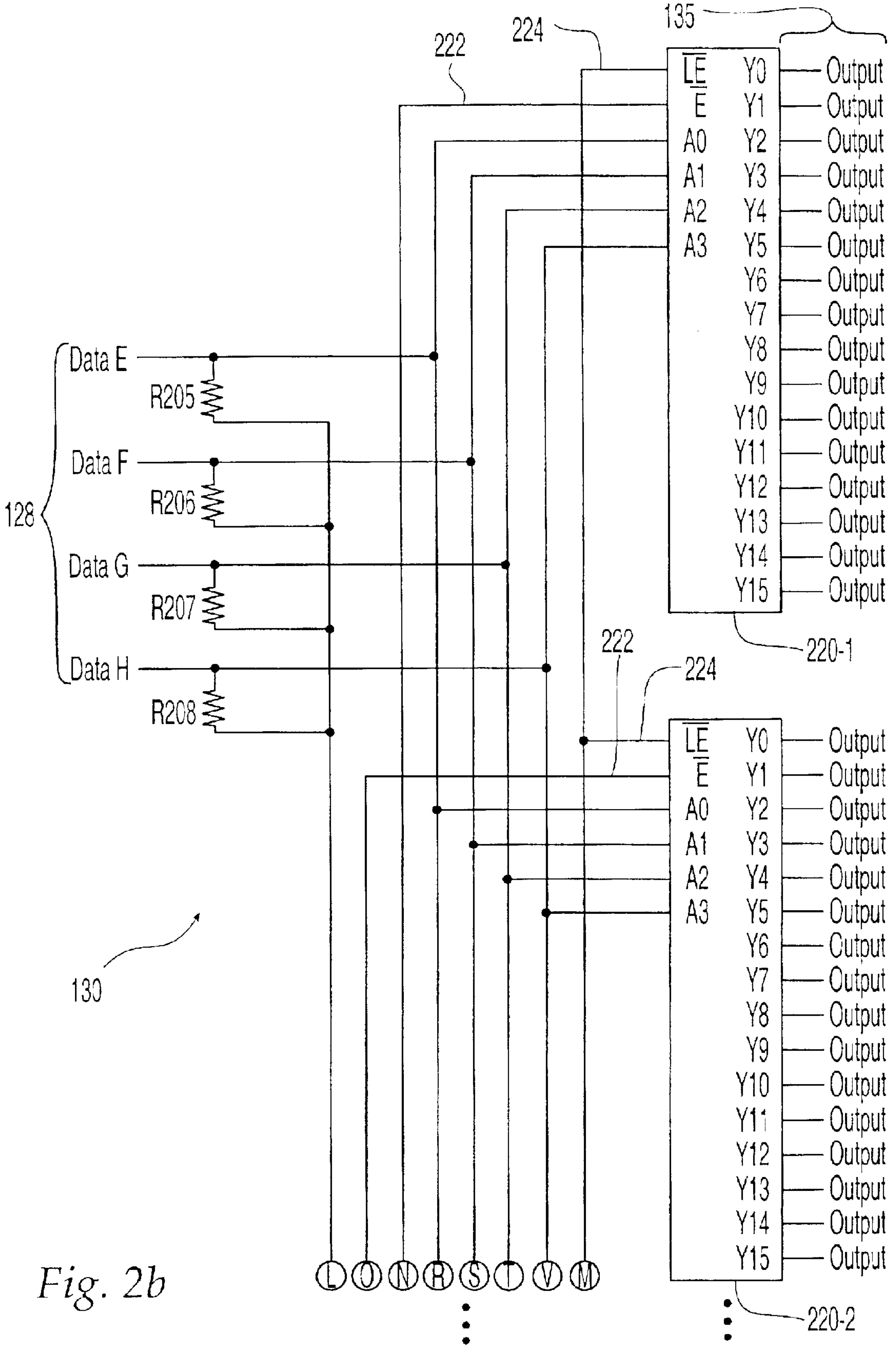
Figure 2C:
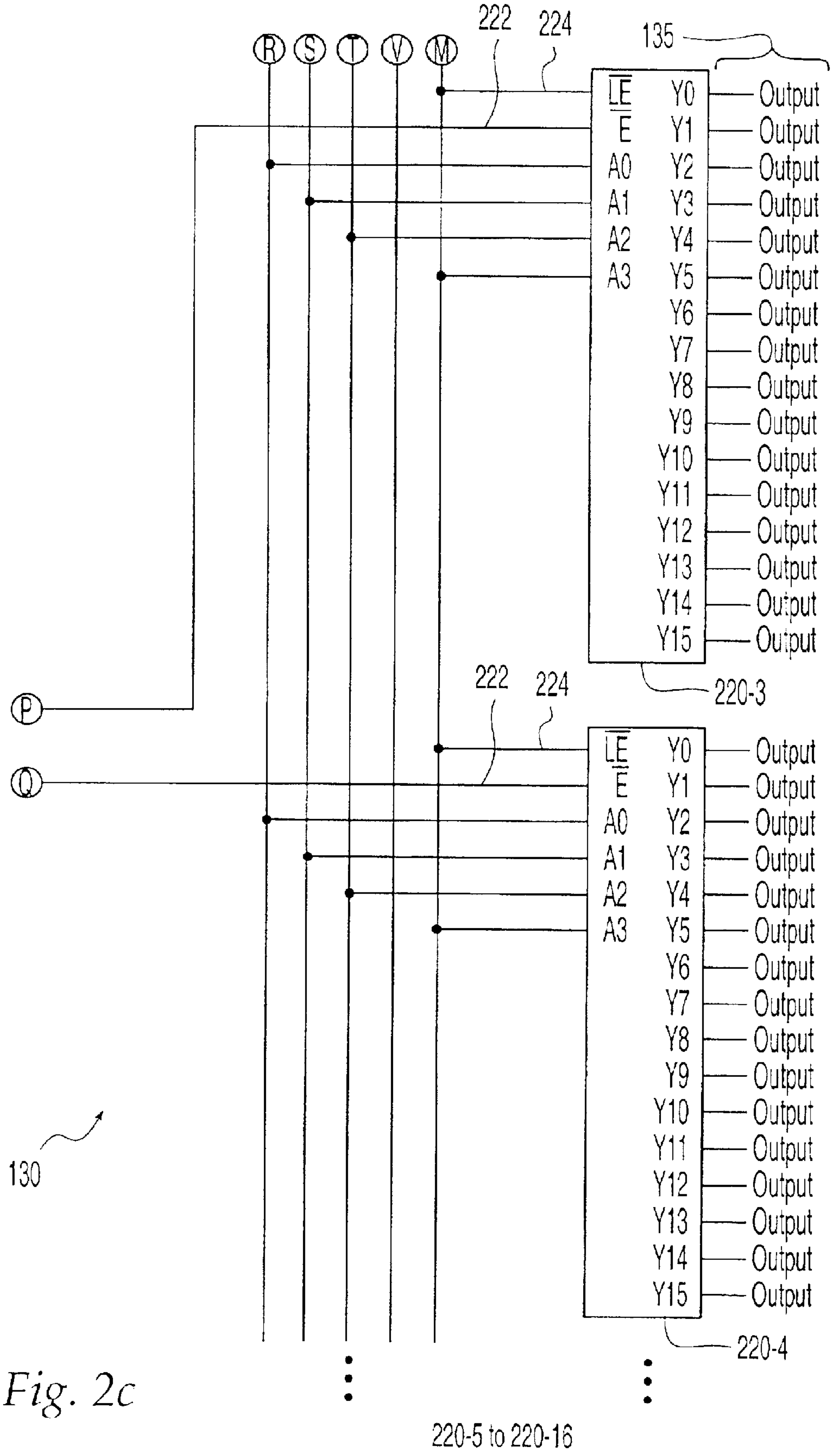

FIGS. 2*a*–2*c* are a block diagram illustrating one possible implementation of M to N decoder circuit 130 for the specific case of M=8 and N=256. Signal flow between FIGS. 2*a*, 2*b*, and 2*c* is identified by circle connectors L through V as shown. In this embodiment decoder circuit includes a first 4–16 decoder 210 and 16 additional 4–16 decoders 220 (only four decoders 220-1, 220-2, 220-3, and 220-4 are shown in FIGS. 2*a*–2*c*) that are preferably implemented on a centralized decoder circuit board. Decoder circuit 130 receives the eight address bits 128 (Data A through Data H), for example via an 8-way male pin header. As shown, each of the signals carrying address bits Data A through Data H is preferably connected to ground (i.e., the neutral reference for the 5 VDC signal 112) through a resistor, R201 through R208 respectively. Resistors R201 through R208 (each of which may, for example, have a resistance of 1 KΩ) help ensure a true zero condition for all low data states of address bits 128.

Referring to FIGS. 2*a*–2*c*, address bits Data A to Data D are provided to decoder 210 while address data bits Data E to Data H are provided to each decoder 220. In response to address data bits Data A to Data D, one of outputs /Y0 to /Y15 of decoder 210 is set low while the other outputs are set high. An active low enable pin 212 of decoder 210 is connected to ground, and an active low input latch enable pin 214 of decoder 210 is connected to the 5VDC signal 112 (i.e., VCC). In this manner, decoder 210 is always enabled and the input address bits Data A to Data D are not latched, so that the outputs /Y0 to /Y15 of decoder 210 change as the address bits Data A to Data D change.

Outputs /Y0 to /Y15 of decoder 210 are connected to the active low enable pins 222 of decoders 220-1 to 220-16 respectively, so that only one decoder 220 is enabled at one time (the enabled decoder 220-*i* corresponds to the decoder 210 output that is set low by address bits Data A to Data D). In response to address data bits Data E to Data H, one of outputs Y0 to Y15 of the enabled decoder 220 is set high (active) while the other outputs are set low. The outputs Y0 to Y15 of each decoder 220 together provide the N decoder outputs 135 that are provided to relay circuit 140. Again, only one of outputs 135 is active or enabled at any one time. The active low input latch enable pin 224 of each of decoders 220 is connected to the 5VDC signal 112 (i.e., VCC), so that so that the outputs Y0 to Y15 of the enabled decoder 220 change as the address bits Data E to Data H change.

To illustrate, address bits Data A through Data D may enable a particular decoder 220 as set out in Table I below.

TABLE I

| Address Bits 128 Data A–Data D | | | | |
|---|---|---|---|---|
| D | C | B | A | Enables 4-16 decoder |
| 0 | 0 | 0 | 0 | 220-1 |
| 0 | 0 | 0 | 1 | 220-2 |
| 0 | 0 | 1 | 0 | 220-3 |
| 0 | 0 | 1 | 1 | 220-4 |
| 0 | 1 | 0 | 0 | 220-5 |
| 0 | 1 | 0 | 1 | 220-6 |
| 0 | 1 | 1 | 0 | 220-7 |
| 0 | 1 | 1 | 1 | 220-8 |
| 1 | 0 | 0 | 0 | 220-9 |
| 1 | 0 | 0 | 1 | 220-10 |
| 1 | 0 | 1 | 0 | 220-11 |
| 1 | 0 | 1 | 1 | 220-12 |
| 1 | 1 | 0 | 0 | 220-13 |
| 1 | 1 | 0 | 1 | 220-14 |
| 1 | 1 | 1 | 0 | 220-15 |
| 1 | 1 | 1 | 1 | 220-16 |

Similarly, address bits Data E through Data H may provide an active output in the enabled decoder 220 as set out in Table II below.

TABLE II

| Address Bits 128 Data E-Data H | | | | Output of enabled |
|---|---|---|---|---|
| H | G | F | E | 4-16 Decoder 220-i |
| 0 | 0 | 0 | 0 | Y0 |
| 0 | 0 | 0 | 1 | Y1 |
| 0 | 0 | 1 | 0 | Y2 |
| 0 | 0 | 1 | 1 | Y3 |
| 0 | 1 | 0 | 0 | Y4 |
| 0 | 1 | 0 | 1 | Y5 |
| 0 | 1 | 1 | 0 | Y6 |
| 0 | 1 | 1 | 1 | Y7 |
| 1 | 0 | 0 | 0 | Y8 |
| 1 | 0 | 0 | 1 | Y9 |
| 1 | 0 | 1 | 0 | Y10 |
| 1 | 0 | 1 | 1 | Y11 |
| I | 1 | 0 | 0 | Y12 |
| 1 | 1 | 0 | 1 | Y13 |
| I | I | 1 | 0 | Y14 |
| 1 | 1 | 1 | 1 | Y15 |

In the embodiment of FIGS. 2*a*–2*c*, the 4–16 decoders 210 and 220 are preferably implemented using a high speed CMOS devices. For example, decoder 210 may comprise a Texas Instruments 74HC4515 integrated circuit (IC) with active low outputs while the 4–16 decoders 220 may each comprise a Texas Instruments 74HC4514 IC with active high outputs. Other chips of similar functionality may also be used (with some retrofitting and/or redesign of data routing, if necessary)

Figure 3A:
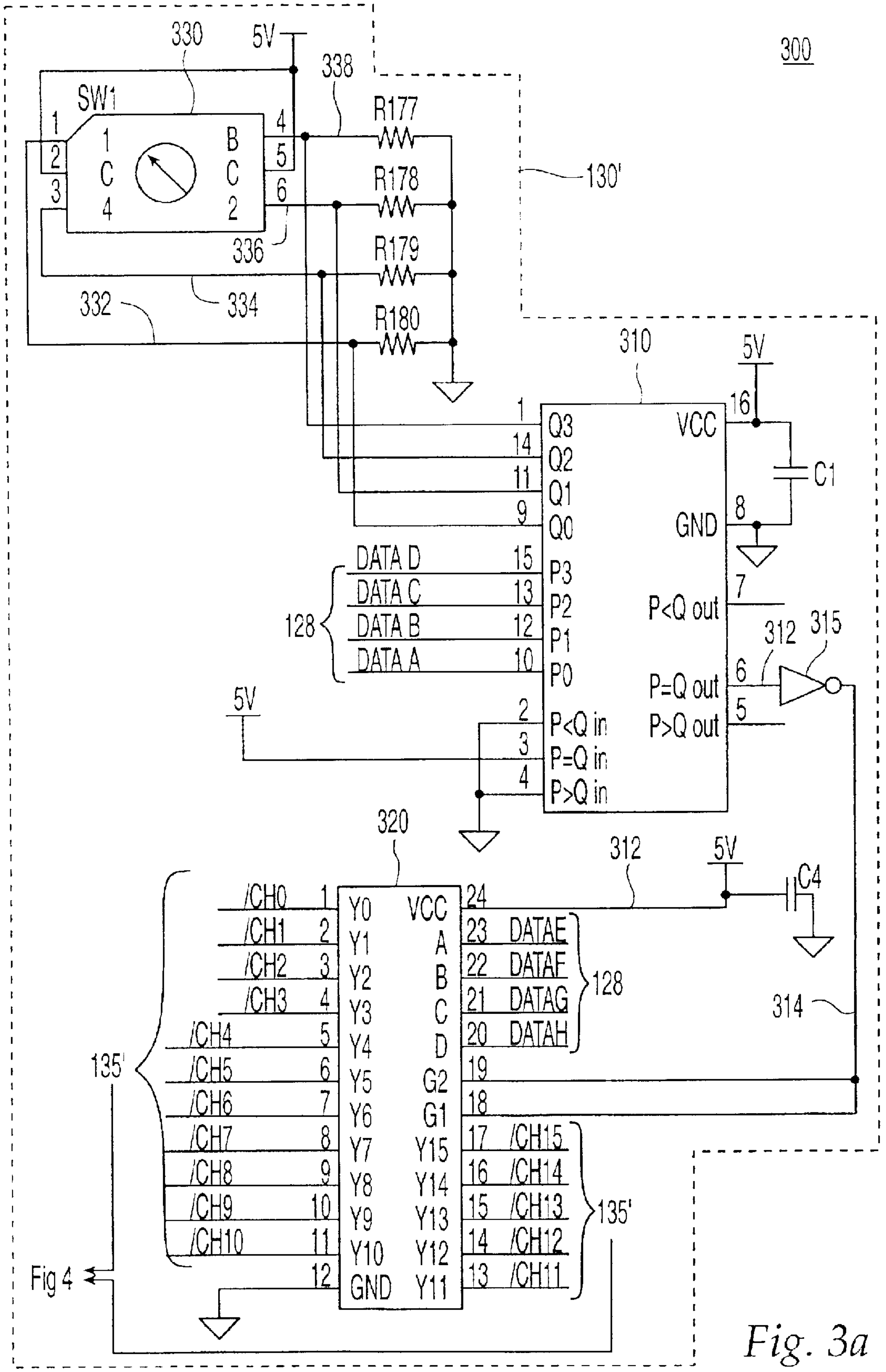
FIGS. 3*a*–3*c* are a block circuit diagram illustrating another possible implementation of the M to N decoder 130.
Figure 3B:
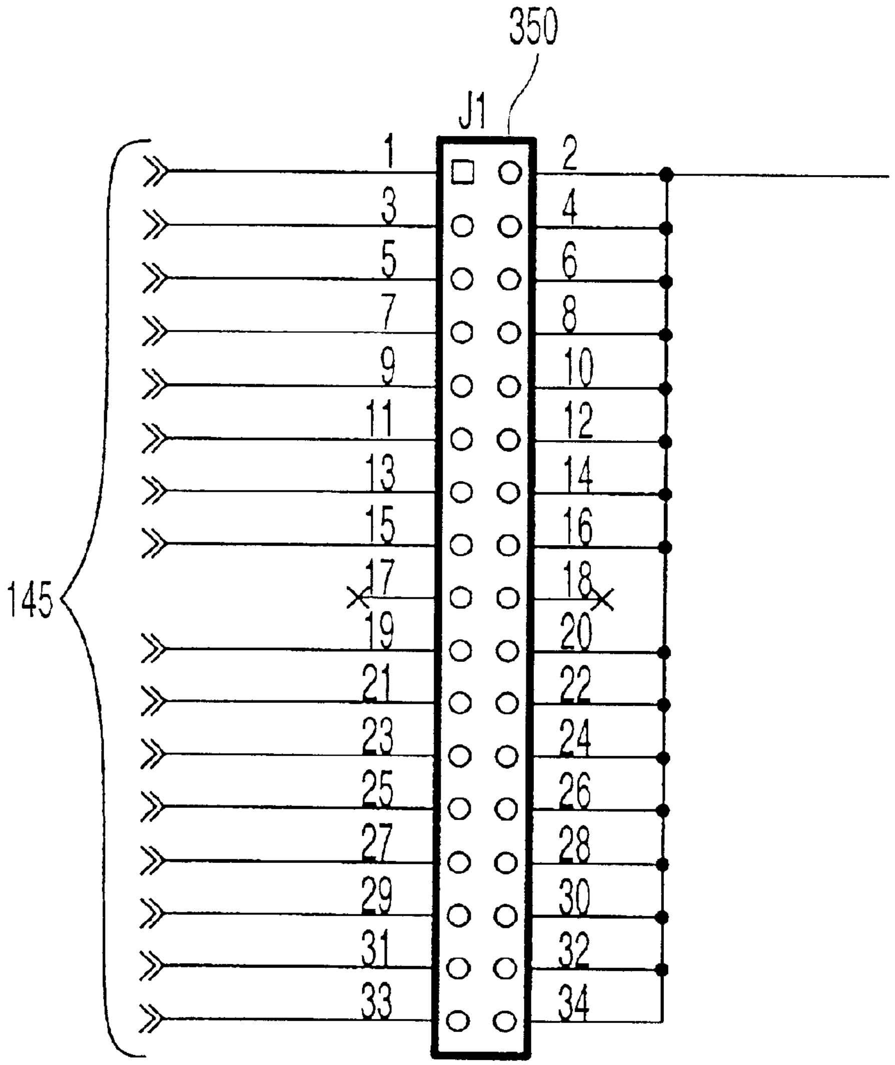
Figure 3C:
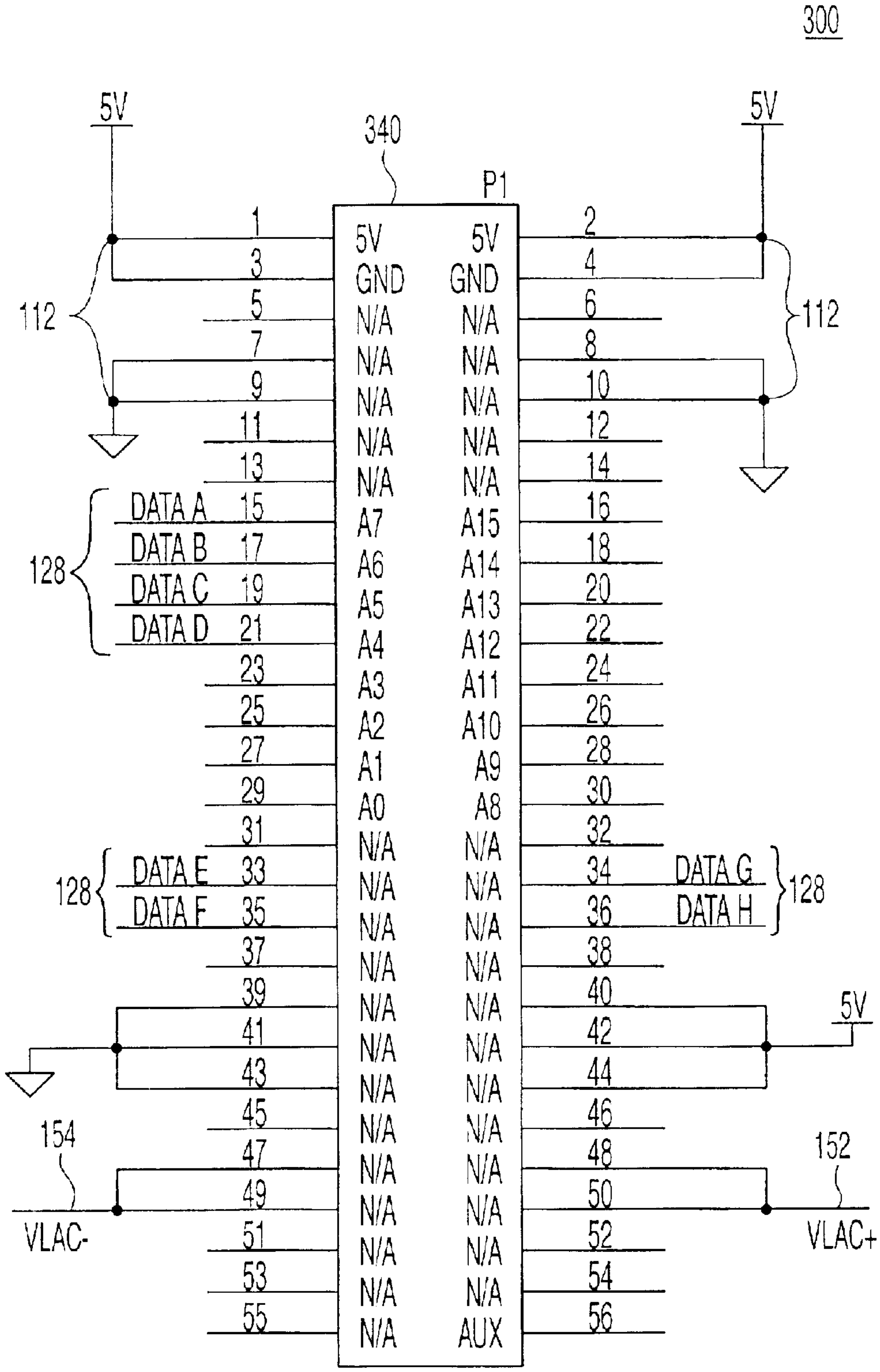

FIGS. 3*a*–3*c* illustrate another possible implementation of a M to N decoder 130'. In this embodiment, rather than centralizing decoder ICs 210 and 220 onto one card or board (as is preferably done in the embodiment of FIGS. 2*a*–2*c*), decoder circuit 130' may be decentralized onto a plurality of cards or boards 300. For the specific case of M=8 and N=256, decoder circuit 130' is provided on 16 separate cards, and FIGS. 3*a*–3*c* show a circuit block diagram of the portion of decoder circuit 130' that resides on one of those cards. Optionally, the portion of decoder circuit 130' in FIGS. 3*a*–3*c* may be combined with an associated portion or sub-circuit 400 of relay circuit 140 (shown in FIG. 4 and describe below) onto the same board 300. Decentralization of the decoder circuit in this manner conveniently provides for a broader and more flexible form of modularization, allowing the number of outputs or loads used in any given application of control circuit 100 to be varied by adding or removing such decoder/relay cards as necessary.

Figure 5:
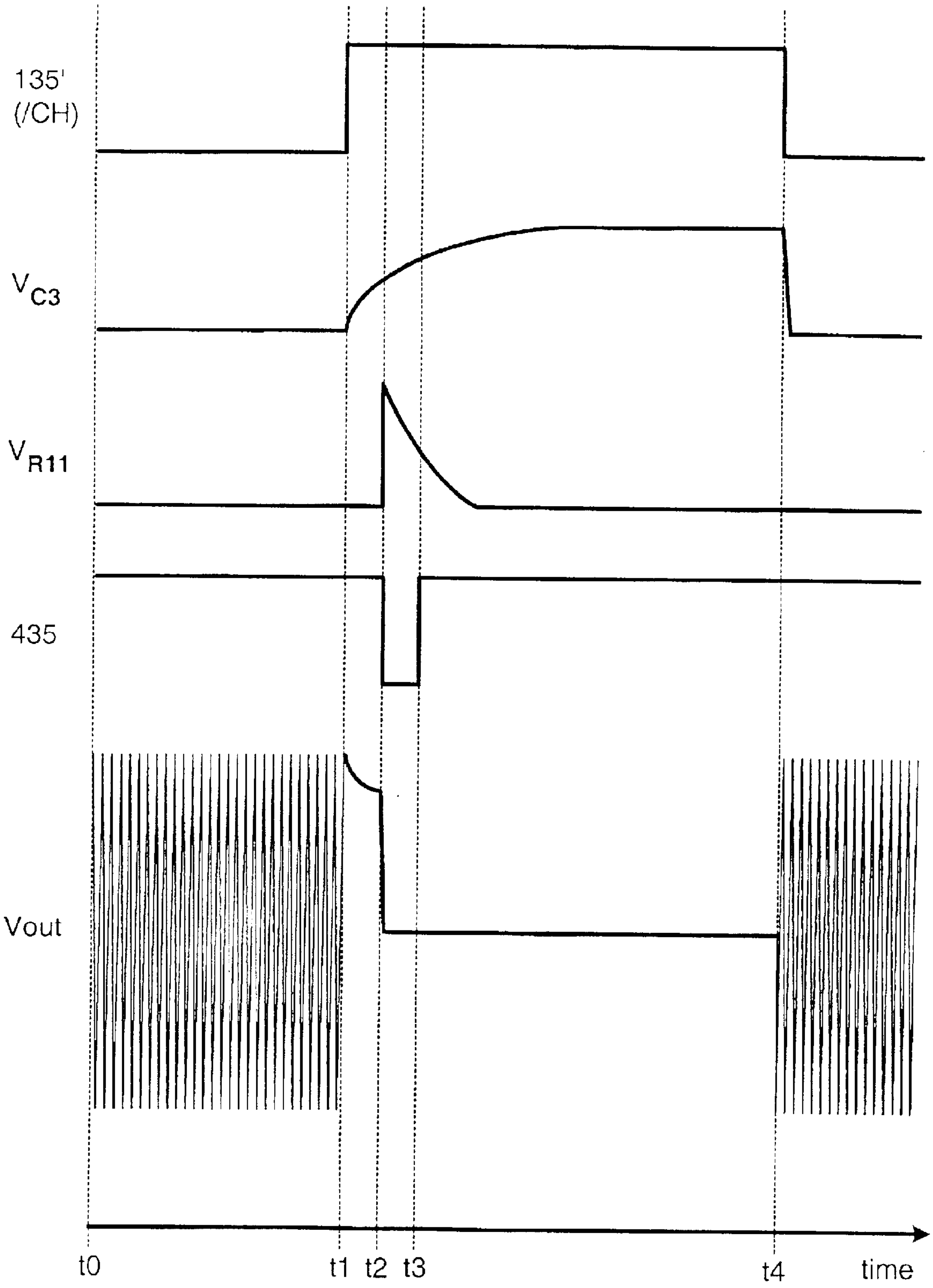
FIG. 5 is a timing diagram for several signals in FIG. 4.

Referring to FIGS. 3*a*–3*c*, on each card 300, each decoder circuit portion 130' comprises a 4-bit comparator IC 310, a 4–16 decoder IC 320, and a 4-bit board address switch 330 in this specific embodiment. Also included on board 300 are an input/output (I/O) card 340 and a load connector 350, although the signal flow between FIGS. 3*a*, 3*b*, and 3*c* is not shown for the sake of clarity. As indicated above, board 300 also preferably includes a portion 400 of relay circuit 140 as shown in FIG. 5, and in this case connector 350 is used to provide signals on load outputs 145 (that are generated on the particular board 300) to corresponding load devices (not shown).

As shown in FIGS. 3*a*–3*c*, I/O card 340 receives the address bits 128 (Data A through Data H), the signals on lines 152 (VLAC+) and 154 (VLAC−), and the 5VDC and neutral signals 112 as inputs on to board 300. Four outputs 332, 334, 336, and 338 from switch 330 are, respectively, provided to inputs Q0, Q1, Q2, and Q3 of comparator 310. Board address switch 330 may be a rotary or equivalent style switch and provides a unique address (specified by outputs 332, 334, 336, and 338) for the board 300 on which switch 330 resides. Address bits Data A, Data B, Data C, and Data D are also provided as inputs P0, P1, P2, and P3 to comparator 310. Comparator 310 is configured or enabled (via a P=Q pin) to generate an active high output 312 when the board address specified by switch 330 matches the address specified by the address bits Data A through Data D. Comparator output 312 is inverted by an inverter 315 to provide an active low enable signal 314 to decoder IC 320. Decoder 320 receives address bits Data E, Data F, Data G, and Data H as inputs and generates an active low output on one of its outputs Y0 through Y15 in response. Again, only one decoder 320 output is low (the other outputs Y0 through Y15 are high) at any one time, and the relationship between address bits Data E through Data H and outputs Y0 through Y15 may be, for example, as set out in Table II above. As shown in FIGS. 3*a*–3*c*, decoder outputs Y0 through Y15 provide load enable signals 135', referenced as /CH0 through /CH15, to a corresponding portion 400 of relay circuit 140, shown in FIG. 4.

As shown in FIGS. 3*a*–3*c*, outputs 332, 334, 336, and 338 from switch 330 are also preferably connected to ground via a resistor R177, R178, R179, and R180 respectively, each of which may have a resistance of 5.1 kΩ. Capacitors C1 and C4 (each of which may have a capacitance of 0.1 μF) are also connected between the VCC and GND pins of comparator 310 and 4–16 decoder 320 respectively. In one implementation, comparator 310 may comprise a Texas Instruments 74HC85 IC 4-bit comparator, while decoder may comprise a 74HC154 IC which is a 4–16 decoder with active low outputs.

Figure 4:
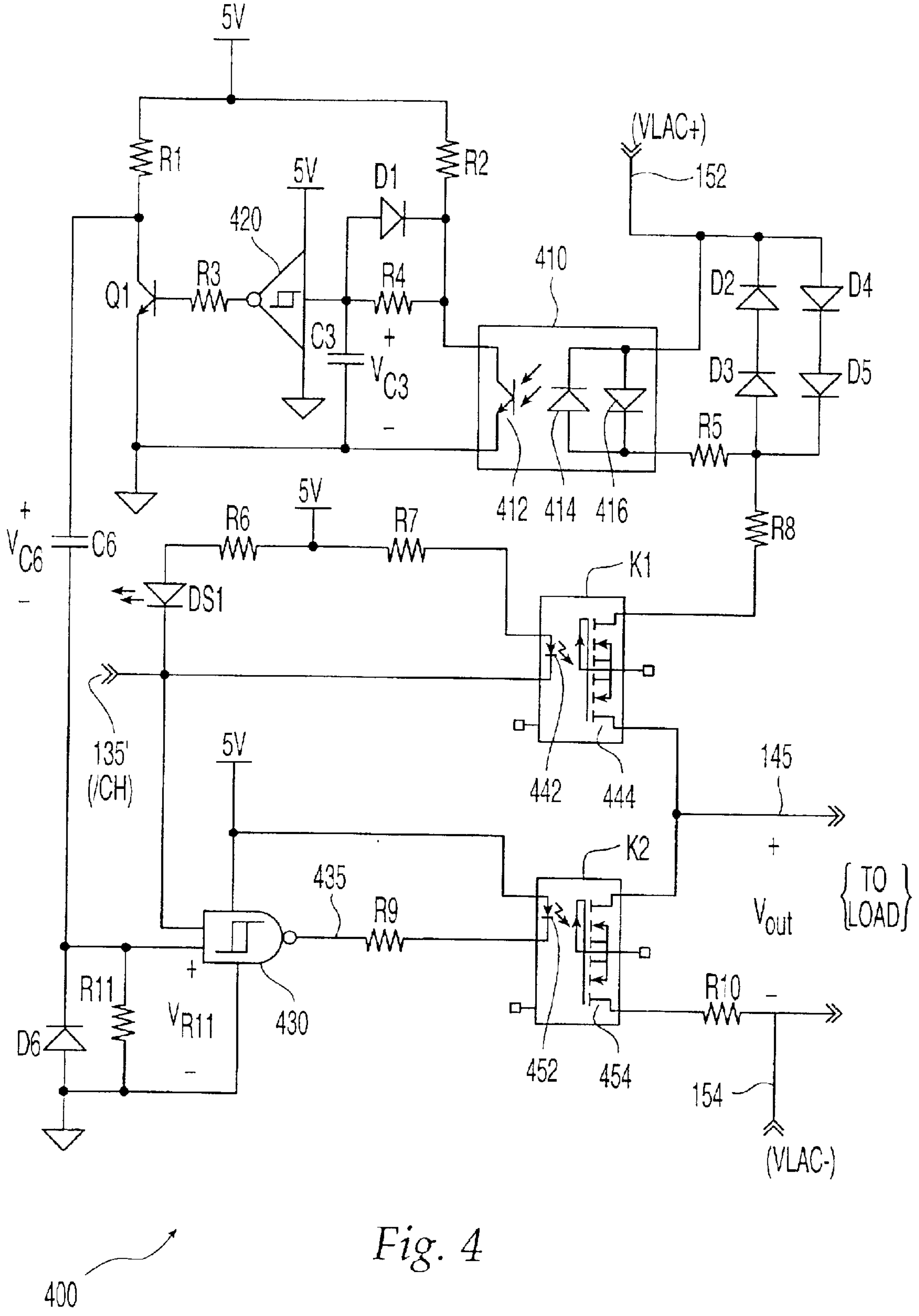
FIG. 4 is a circuit diagram of a portion of the relay circuit in the control circuit of FIGS. 1*a*–1*b* in accordance with a preferred embodiment.

Referring now to FIG. 4, a portion or sub-circuit 400 of relay circuit 140 is shown in accordance with a preferred embodiment of the present invention. Each /CH load enable signal 135' generated in FIGS. 3*a*–3*c* is provided to a corresponding relay sub-circuit 400 where the active low signal 135' is used to gate the application of the drive voltage VLAC to a load that also corresponds to the particular signal 135'. Thus, when incorporated onto a card 300 in the above described embodiment, each card 300 includes 16 sub-circuits 400, one for each /CH0 through /CH15 load enable signal 135'.

In addition to the active low load enable signal 135', relay sub-circuit 400 receives the VLAC+ signal on line 152 and the VLAC− signal on line 154 generated by inverter circuit 150 (as noted above these may be provided on to a modular board 300 via I/O card 340). As shown in FIG. 4, the VLAC+ signal is coupled to a first terminal of a relay K1 via a cross-connected set of two diode pairs D2-D3 and D4-D5 and via a resistor R8. The second terminal of relay K1 is connected to the load output line 145. Relay K1 is preferably a solid state relay, such as an AD6C311 from Solid State Optronics, Inc, that is suitable to switch load driving signals that may have a relatively high voltage (e.g.90–150 VAC), and frequency (e.g., up to 2500 Hz). In known manner, when a sufficient threshold current flows through a light emitting diode (LED) 442 connected between the input terminals of relay K1, a pair of transistors 444 in relay K1 turn on to close the relay and effectively connect the first and second terminals of relay K1. Since the anode of LED 442 is coupled to the 5VDC signal or Vcc (i.e., signal 112) through a resistor R7, and since the cathode of LED 442 is connected to the load enable signal 135' or /CH, relay K1 closes when the load enable signal 135' or /CH is low or active. When relay K1 closes VLAC+ is coupled to output line 145 so that a voltage Vout can be provided to the corresponding load. Resistor R8 is preferably included to limit the current flowing through relay K1 when the latter is closed. As shown in FIG. 4, sub-circuit 400 may optionally include an indicator LED DS1 having an cathode connected to load enable signal 135' (/CH) and an anode coupled to 5 VDC (i.e.,Vcc) through a resistor R6. In this manner, when signal 135' is low or active, DS1 turns on and illuminates to provide a visual indication that the particular load is currently being driven.

As indicated above, it may be desirable to switch or sequence the driving of a plurality of electroluminescent loads at rates of up to one load every 50 milliseconds or faster to provide, for example, a desired lighting effect. Thus, relay K1 should be able to turn a load on and turn a load off at a rate that is faster than the sequencing rate between outputs. As indicated, the use of a solid state relay as opposed to an electromechanical one is generally preferable due to a solid state relay's smaller size and lack of moving parts. The AD6C311 solid state relay, for example, has a maximum turn-on or close time of 5 milliseconds and a maximum turn off time of 0.5 milliseconds. In addition, in many instances it is desirable for an electroluminescent load to appear as if it snaps on and snaps off. Again, the snapping on and snapping off may need to occur sufficiently faster than the sequencing rate between loads to ensure the desired effect. However, the snapping off effect is difficult to achieve in the case of electroluminescent loads, since these loads effectively act as light emitting capacitors, storing voltage or potential that must be discharged once the driving voltage Vout is removed or disabled. To facilitate the ability to rapidly sequence between loads and to permit the snapping off effect to be achieved for electroluminescent loads, relay sub-circuit 400 preferably includes a second relay for rapidly discharging the load upon the removal of the driving voltage VLAC.

Referring again to FIG. 4, the VLAC+ signal in sub-circuit 400 is also coupled to a first input of an optocoupler 410 via the cross-connected diode pairs D2-D3 and D4-D5 and a resistor R5. The VLAC+ signal is further directly connected to a second input of the optocoupler 410. cross-connected pair of LEDS 414 and 416 are connected between the inputs of optocoupler 410, so that when sufficient current flows, in either direction, between those input terminals, a phototransistor 412 turns on. Optocoupler 410 may be an H11AA814 from Fairchild Semiconductor. When relay K1 is open, no current flows between the input terminals of optocoupler 410, and phototransistor 412 remains off (i.e., has a high impedance across it. However, when relay K1 is closed, current flows through LED 414 or LED 416 and phototransistor 412 turns on, so that optocoupler 410 effectively senses the flow of current into the load. It should be noted that diodes D2, D3, D4, and D5 are preferably included in sub-circuit 400 to prevent any overdrive of optocoupler 410, and similarly resistor R5 is preferably used to limit the current flowing through the input terminals of optocoupler 410.

Referring still to FIG. 4, phototransistor 412 in optocoupler 410 has an emitter coupled to ground and a collector coupled to 5VDC (i.e., Vcc) via a resistor R2. A capacitor C3 in series with a parallel combination of a resistor R4 and a diode D1 are also connected across phototransistor 412. More specifically, capacitor C3 has a first terminal connected to ground and a second terminal connected to a first terminal of resistor R4 and the anode of Diode D1, while the second terminal of resistor R4 and the cathode of Diode D1 are connected to the collector of phototransistor 412. The second terminal of capacitor C3, and therefore the voltage $V_{C3}$, is also connected to the input of an inverting Schmitt trigger 420. The output of inverting Schmitt trigger 420 is coupled through a resistor R3 to the base of a transistor Q1. The collector of transistor Q1 is coupled to the 5VDC (Vcc) signal through a resistor R1, while the emitter of Q1 is connected to ground. The collector of Q1 is also connected to a first terminal of capacitor C6. The second terminal of capacitor C6 is connected to the cathode of a diode D6, to a first terminal of a resistor R11, and to a first input of a NAND gate 430. The anode of diode D6 and the second terminal of resistor R11 are each connected to ground, so that D6 and R11 are connected in parallel. A second input of NAND gate 430 receives the active low enable signal 135' or /CH.

The output 435 of NAND gate 430 is coupled, via a resistor R9, to a second relay K2, that again is preferably a solid state relay and may also be implemented using a AD6C311 device. Thus, as shown, when a sufficient threshold current flows through a light emitting diode (LED) 452 connected between input terminals of relay K2, a pair of transistors 454 in relay K2 turn on to close the relay and effectively connect first and second terminals of relay K2. As shown, The first input of relay K2 (corresponding to the anode of LED 452) is connected to the 5 VDC (or Vcc) signal while the second input (corresponding to the cathode of LED 452) is coupled to output 435 of NAND gate 430. The first terminal of relay K2 is connected to the output line 145 signal while, the second terminal of relay K2 is coupled through a resistor R10 to the VLAC− signal 154. Thus, when output 435 of NAND gate 430 goes low, relay K2 closes, and a low impedance shunt connection is provided across the load.

In operation, when circuit 400 is in a steady state load off condition, load enable signal 135' (or /CH) is high, relay K1 is open, phototransistor 412 is off, and capacitor C3 is charged by the 5 VDC signal (through resistors R2 and R4) so that the voltage $V_{C3}$ provided across capacitor C3 is high (substantially equal to Vcc). The output of inverting Schmitt trigger 420 provides a low signal at the base of transistor Q1, turning transistor Q1 off (the low output of Schmitt trigger 420 is triggered during the charging of C3, when the voltage $V_{C3}$ rises above a threshold level, e.g., around 2.7 V). With Q1 off, capacitor C6 is charged by the 5 VDC signal (through resistors R1 and R11) so that the voltage $V_{C6}$ provided across capacitor C6 is also high and substantially equal to Vcc. With $V_{C6}$ high the voltage across resistor R11, $V_{R11}$, is at a low level. Since $V_{R11}$, an input to NAND gate 430, is low, the output 430 of NAND gate 435 is high and relay K2 is off.

When load enable signal 135' (/CH) goes low, i.e., becomes active, K1 turns on, coupling the VLAC+ signal 152 to output line 145. Current flows through cross-connected diode pair 414 and 416 in optoisolator 410, and in response phototransistor 412 turns on. Diode D1 provides a low impedance path through which C3 can quickly discharge. As C3 discharges, the output of inverting Schmitt trigger 420 is triggered high, so that a high voltage is provided at the base of transistor Q1, turning transistor Q1 on. (To ensure that $V_{C3}$ remains below a threshold voltage of inverting Schmitt trigger 420, the resistance of R2 and R4 and the capacitance of C3 is preferably chosen so that the time constant of that RC network, (R2+R4)*C3, is substantially larger than one half period of the load driving signal VLAC.) With Q1 on, diode D6 provides a low impedance path through which C6 can quickly discharge. The voltage $V_{R11}$, across resistor R11 remains low (as is load enable signal 135' (/CH) which is also provided as an input to NAND gate 430), and so the output 430 of NAND gate 435 stays high keeping relay K2 off. The voltage taken between the output line 145 and the inverter output voltage line 154 (VLAC−), Vout, is thereby provided to the load.

FIG. 5 is a timing diagram illustrating how the rapid load discharge circuitry in relay sub-circuit 400 operates in the case of an electroluminescent load. FIG. 5 shows waveforms for the load enable signal 135' (/CH), the voltage $V_{C3}$ across C3, the voltage $V_{R11}$ across R11, the output voltage 435 of NAND gate 430, and the load output voltage Vout (taken between lines 145 and 154). At the onset starting at time t0 in FIG. 5, load enable signal 135' (/CH) is low, C3 is discharged, $V_{R11}$ is low, the output 435 of NAND gate 430 is high (maintaining relay K2 off), and Vout provides an AC voltage (essentially the VLAC output from inverter 150) to the load. At time t1, the active low enable signal 135' (/CH) disables the load by going high. As described above, phototransistor 412 turns off and C3 charges, i.e., $VC_{C3}$ rises. Also at time t1, the inverter 150 output VLAC+ signal is disconnected from the load by relay K1, and, as a result, the Vout voltage across the load starts to decrease as the electroluminescent load discharges the energy it stored during its activation. As illustrated in FIG. 5, however, the discharging of the electroluminescent load may take place relatively slowly.

Referring still to FIG. 5, at time t2 $V_{C3}$ reaches an upper voltage threshold level of inverting Schmitt trigger 420, and Q1 is then triggered off. Subsequently, 5VDC is applied across resistor R1, capacitor C6, and resistor R11. Capacitor C6, consequently, begins to charge. Resistor R11 is preferably significantly larger than resistor R1 so that most of the 5VDC is distributed across resistor R11 and $V_{R11}$ pulses to a high state when Q1 initially turns off. Since, at time t2, both inputs to NAND gate 430 (i.e., $V_{R11}$ and load enable signal 135') are high, the NAND gate output 435 goes low, turning relay K2 on. As a result, a low impedance shunt is provided across the load enabling the residual voltage across the load to rapidly discharge, as shown after time t2 in the load voltage Vout. In the illustrated embodiment, the shunt impedance comprises the resistance between the connected terminals of relay K2 (which is relatively minimal) and the resistance of resistor R10. As will be appreciated, resistor R10 preferably has a relatively low resistance, however this resistance should also be high enough to limit the current flowing through relay K2 during the load discharge to sufficiently protect relay K2.

In the above manner, a desired snap-off effect can be provided for the electroluminescent load once application of the inverter drive voltage VLAC is disabled. As capacitor C6 continues to charge and $V_{C6}$ increases, the $V_{R11}$ voltage correspondingly decreases until it drops below a threshold voltage and provides a low input to NAND gate 430 at time t3. The NAND gate output 435 returns to a high state, opening relay K2 and removing the rapid load discharge shunt connection. The load then remains disabled until control circuit 100 once again activates the enable signal 135' for that load at time t4. When this occurs, relay K1 closes applying the VLAC+ signal to output line 145. Capacitor C3 also discharges since phototransistor 412 is turned on by the load current sensed by optoisolator 410. It will also be appreciated that, when load enable signal 135' goes high or inactive, as illustrated at time t1 in FIG. 5, the load enable signal should remain low at least until time t3 (plus the turn off time for relay K2) to ensure that VLAC+ is not coupled to output line 145 when K2 is closed or on. (Load enable signal 135' generally need only remain low or active long enough to accommodate the turn on time for relay K1.) Typically, such a minimum inactive time for load enable signal 135' may be about 20 milliseconds or less, which still allows rapid sequential energization, in any order, of a plurality of loads.

As an example, in one specific implementation, the components in relay sub-circuit 400 may have the following values: R1=R2=5.1 kΩ; R3=2 kΩ; R4=240 kΩ; R5=R8=R10=47 Ω; R6=R7=R9=750 Ω; R11=56 kΩ; C3=0.047 μF; and C6=0.1 μF.

Figure 6:
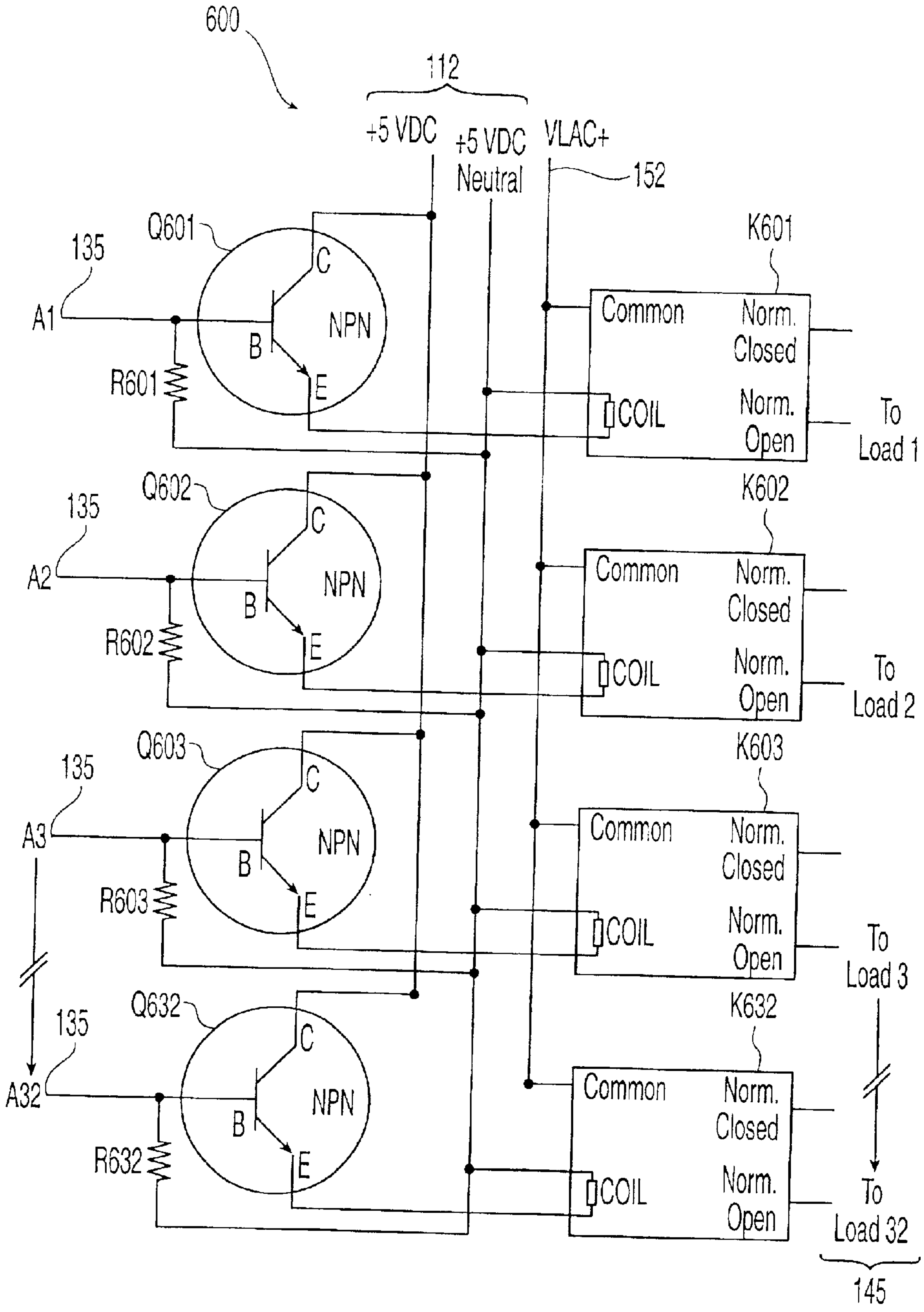
FIG. 6 is a circuit diagram of a portion of the relay circuit in accordance with another embodiment.

In an alternative embodiment, FIG. 6 is a circuit diagram of a possible circuit 600 for implementing each relay board or card 142 in relay circuit 140 of FIGS. 1*a*–1*b*. In the illustrated embodiment of FIG. 6, relay sub-circuit 600 on a card 142 receives 32 active high load enable signals 135 (labeled A1 through A32 in FIG. 6). Relay circuit 600 also receives the 5VDC and neutral (ground) signals 112 and the VLAC+ signal on line 152. Each load enable signal A1 through A32 is connected to the base of a transistor Q601 through Q632 respectively. Each load enable signal A1 through A32 is also coupled to ground, i.e. the neutral reference for the 5VDC signal 112, through a resistor R601 through R603 respectively. The collectors of each of transistors Q601 through Q632 are coupled to the 5 VDC or Vcc signal 112 (e.g., through resistors, not shown) while the emitters of transistors Q601 through Q632 are coupled to a first coil input of an electromechanical relay K601 through K632. As will be appreciated, when using circuit 100 to control non-electroluminescent loads, it may be necessary and/or desirable to use electromechanical relays in some cases. The other coil input of each electromechanical relay K601 through K632 is connected to ground. The coil of each relay is preferably a 5VDC relay coil. The inverter output signal VLAC+ 152 is coupled as a pass voltage to the common terminal of each relay K601 through K632.

In operation, when a load enable signal 135 goes high or active, the corresponding transistor is turned on, allowing current to flow through the transistor and through the coil of the corresponding relay. With the coil energized, the normally open connection closes coupling the VLAC+ signal on line 152 to a corresponding load (not shown). The inclusion of the transistor in the current path of the relay coil prevents the relay coil from drawing too much current (as would occur if the 5VDC coil were triggered by the logic signals 112 alone). In effect, each transistor Q601 through Q632 acts as a "pilot" for the corresponding relay coil voltage. As an alternative to the transistor/relay combination of FIG. 6, other switching and current limiting techniques may also be used. For example, relay circuit 600 may comprise "low energy" electromechanical relays designed to provide only a small amount of current through and voltage across its coil when triggered.

As indicated, control circuit 100 preferably are housed within a control device enclosure. Generally, the housed device is preferably of a reasonable size and weight for a given application, and may also conform to industry standards for mounting. However, when circuit 100 is used to drive a large number of loads, the dimensions and configurations of many of the components may be such that they may not fit on a single circuit board or card. Furthermore, it is often not desirable to install all the components on one board since this limits the flexibility of the control device. Consequently, as described above, components of circuit 100 may be grouped into various modules. For example with N=256 loads, eight transistor/relay switching boards 600 (FIG. 6) may be used. Alternatively sixteen decoder/ switching boards 300, as described in connection with FIGS. 3*a*–3*c* and FIG. 4, may be used. Similarly, DMX converter 120 can also be fitted onto a card or board and mounted in the housed device in any suitable manner. Within the device housing, the power supply and the various modules may be connected by any appropriate routing or bus technique to transfer power and signals within circuit 100. For example, two-way male headers or ribbon cables may be used with compatible connectors on the boards. (The housing preferably includes suitable input and output connectors as well, depending on the application and the types of loads being controlled.)

Modularization in the above manner conveniently allows an end user to use less loads and boards than the maximum N, while retaining the ability to subsequently insert additional boards to accommodate more loads or outputs. For example, if only 128 outputs are needed, only eight (and not 16) decoder/switching boards 300 are needed. A modular design also facilitates the replacement of faulty or damaged components. Thus, regardless of how many modules or how many switches the invention are configured, implementation of the control circuit of the present invention using modular elements is generally, although not always, preferential to an implementation incorporating a consolidation of all components. Where control circuit 100 is modularized onto several cards or boards, these are preferably of standard size that may fit into a card rack or the like in the control device.

In one embodiment of the invention, one of the output lines 145 (e.g., a "zero" addressed output line) may be connected to a "ghost" load that may, by default, be driven by circuit 100 in the absence of a control signal 125. In this case, a no load condition for inverter circuit 150 can be avoided. The ghost load preferably has the same draw as other loads connected to output lines 145 and may for example be a resistance or impedance network. The ghost load could also be the same type of device as the other loads. For instance, in the case of electroluminescent fiber loads, the ghost load may be a fiber located apart from the other fiber loads, e.g., so that the ghost load is visible to a lighting operator and not as part of an overall lighting display. In this manner, a ghost fiber load can provide a visual indication to the operator that the control circuit 100 is running before a sequencing operation begins. Furthermore, the ghost load can be used to introduce "dark steps" at specific times during a sequential lighting operation when it is desired that no load in the lighting display be on. For example, for an intermittent effect, control circuit 100 may be programmed to drive the ghost load immediately after driving any other load.

In addition, although sequential control circuit 100 is described above as sequentially enabling one output line (or load) at a time, it will be appreciated that control circuit 100 can also be configured to sequentially drive subsets of output lines 145 (or loads). For example, in the embodiment illustrated in FIGS. 3*a*–3*c*, the address switches 330 on two or more boards 300 may be set to specify the same address, so that when address bits Data A to Data D match that address, an output line connected to each board 300 identified with that address is enabled (i.e., the load on each board corresponding to the output line specified by address bits Data E to Data H). Subsets of output lines 145 (and hence loads) may also be activated at the same time in other ways. For example, subset grouping information for loads may be provided within the DMX control signal 125, and converter circuit 120 and decoder circuit 130 man be adapted to enable the simultaneous activation of subsets of output lines 145 at the same time. In all of these cases, the subset of loads being driven still changes sequentially as in the case of single load sequencing. Furthermore, where subsets of loads are sequenced sequentially, it will be appreciated that the inverter circuit 150 (or other power supply circuit used) must be capable of driving more than one load at the same time.

Although the preferred embodiments of the invention have been described in the foregoing description, it will be understood that the present invention is not limited to the specific embodiments described above.

What is claimed is:

1. A control circuit for sequentially driving a plurality of electrical loads from a single power supply comprising:

a converter circuit for receiving a DMX compatible digital control signal and extracting a plurality of address bits therefrom;

a decoder circuit for receiving the digital address bits and in response generating a plurality of enable signals, each corresponding to a particular electrical load, a subset of the load enable signals being in an active state and each other enable signal being in an inactive state at any one time; and a relay circuit for receiving the plurality of enable signals, and in response passing an electrical drive signal to each electrical load corresponding to the subset of enable signals that is in the active state, wherein the relay circuit comprises a plurality of discharge circuits for rapidly discharging each electrical load to snap-off a load when the enable signal corresponding to that load changes from the active state to the inactive state.

2. The control circuit of claim 1 wherein the converter circuit extracts M address bits and the decoder circuit generates N enable signals, and wherein $N \leqq 2^M$ where M and N are integers.

3. The control circuit of claim 2 wherein $N=2^M$.

4. The control circuit of claim 1 wherein the converter circuit extracts the plurality of address bits from data bytes for one or more DMX channels in the control signal.

5. The control circuit of claim 1 wherein the converter circuit extracts one address bit from a data byte for each of a plurality of DMX channels in the control signal.

6. The control circuit of claim 1 wherein the converter circuit extracts the plurality of address bits from a data byte for a single DMX channel in the control signal.

7. The control circuit of claim 1 wherein the converter circuit comprises an address switch for specifying a DMX start channel.

8. The control circuit of claim 1 wherein the relay circuit comprises a first plurality of relay devices each coupled to one of the enable signals as well as to the load corresponding thereto, wherein when said enable signal is in the active state the relay device couples the electrical drive signal to the corresponding electrical load.

9. The control circuit of claim 8 wherein each of the first relay devices comprises a solid state relay device.

10. The control circuit of claim 8 wherein each of the first relay devices comprises an electromechanical relay device.

11. The control circuit of claim 10 wherein each electromechanical relay device is coupled to one of the enable signals through a transistor.

12. The control circuit of claim 1 wherein each discharge circuit comprises a second relay device.

13. The control circuit of claim 12 wherein each of the second relay devices comprises a solid state relay device.

14. The control circuit of claim 1 wherein each discharge circuit establishes a low impedance shunt connection across the corresponding electrical load when the enable signal corresponding to that load changes from the active state to the inactive state.

15. The control circuit of claim 1 wherein the electrical drive signal is an AC voltage signal.

16. The control circuit of claim 1 wherein the electrical drive signal is an AC voltage signal having a variable rms voltage.

17. The control circuit of claim 16 wherein the DMX compatible digital control signal further includes control information for varying the rms voltage.

18. The control circuit of claim 1 wherein the electrical drive signal has a variable frequency.

19. The control circuit of claim 18 wherein the DMX compatible digital control signal further includes control information for varying the frequency of the electrical drive signal.

20. The control circuit of claim 1 wherein the electrical loads are electro luminescent loads.

21. The control circuit of claim 1 wherein the relay circuit is implemented on a plurality of boards, each board corresponding to a group of electrical loads.

22. The control circuit of claim 1 wherein the decoder circuit and the relay circuit are implemented on a plurality of boards, each board corresponding to a group of electrical loads.

23. The control circuit of claim 1 wherein the subset of load enable signals in an active state at any one time consists of only one load enable signal.

24. A control circuit for sequentially driving a plurality of electro luminescent loads from a single power supply comprising:

a decoder circuit for receiving a digital address signal and in response generating a plurality of enable signals, each corresponding to a particular electrical load, a subset of the load enable signals being in an active state and each other enable signal being in an inactive state at any one time; and a relay circuit comprising a plurality of first relay devices each coupled to one of the plurality of enable signals as well as to the load corresponding thereto, wherein when said enable signal is in the active state the relay device couples the electrical drive signal to the corresponding electrical load, and a plurality of discharge circuits for rapidly discharging each electrical load to snap-off a load when the enable signal corresponding to that load changes from the active state to the inactive state.

25. The control circuit of claim 24 wherein each discharge circuit comprises a second relay device.

26. The control circuit of claim 25 wherein each of the first and second relay devices comprises a solid state relay device.

27. The control circuit of claim 24 wherein each discharge circuit establishes a low impedance shunt connection across the corresponding electrical load when the enable signal corresponding to that load changes from the active state to the inactive state.

* * * * *